United States Patent [19]

Kondo

[11] Patent Number: 4,609,935
[45] Date of Patent: Sep. 2, 1986

[54] SEMICONDUCTOR DEVICE WITH AN IMPROVED CROSSING STRUCTURE AT THE INTERSECTION OF A RESISTOR REGION AND A WIRING CONDUCTOR

[75] Inventor: Hideyuki Kondo, Tokyo, Japan
[73] Assignee: NEC Corporation, Tokyo, Japan
[21] Appl. No.: 553,707
[22] Filed: Nov. 21, 1983
[30] Foreign Application Priority Data Nov. 24, 1982 [JP] Japan ................................ 57-205727

[51] Int. Cl.[4] ............................................ H01L 27/02
[52] U.S. Cl. ....................................... 357/51; 357/54; 357/84; 357/53; 357/71
[58] Field of Search ................. 357/84, 53, 51, 71, 357/54

[56] References Cited

U.S. PATENT DOCUMENTS 3,575,371 4/1971 Brown et al. ........................ 357/84
3,602,782 8/1971 Klein ................................... 357/53
4,450,470 5/1984 Shiba .................................. 357/51

OTHER PUBLICATIONS

Fillmore, "Shielded Integrated Circuit Crossunder," RCA Technical Notes, No. 1153, 5/24/76.

Primary Examiner—Andrew J. James
Assistant Examiner—William Mintel
Attorney, Agent, or Firm—Laff, Whitesel, Conte & Saret

[57] ABSTRACT

A semiconductor integrated circuit device has an improved crossing structure between a resistor region and a wiring conductor layer, and there is provided between the resistor region and the wiring conductor an additional conductor layer isolated from both of them. The additional conductor layer is substantially AC-grounded. As a result, the signal transmission caused by the capacitance-coupling between the resistor region and the wiring conductor is prevented by the additional conductor layer.

3 Claims, 11 Drawing Figures

SEMICONDUCTOR DEVICE WITH AN IMPROVED CROSSING STRUCTURE AT THE INTERSECTION OF A RESISTOR REGION AND A WIRING CONDUCTOR

BACKGROUND OF THE INVENTION

The present invention relates to a semiconductor device, and more particularly to an integrated semiconductor circuit device wherein a wiring conductor layer crosses over or under a semiconductor resistor region.

Resistors formed within an integrated semiconductor circuit device are constituted by, for example, a semiconductor region of one conductivity type formed in a semiconductor substrate. Their resistance values are determined by the sheet resistance, width, and length of the respective semiconductor regions. In addition to the resistors, the integrated semiconductor circuit device has a large number of other circuit elements such as transistors, diodes and capacitors. Wiring conductor layers are used for interconnecting the respective circuit elements. The wiring conductor layers are formed over an insulation film covering the semiconductor substrate. The wiring layers are connected through contact holes formed in the insulation film to elements in the substrate.

Some of the wiring conductor layers often cross over the resistor region. The wiring conductor and the resistor region are isolated from each other by the insulation film. However, at the intersecting section, the construction is conductor-insulator-semiconductor. This construction is the same as that of a MIS (metal-insulator-semiconductor) capacitor. In other words, the resistor region and the wiring conductor layer are capacitance-coupled to each other at the intersecting portion. For this reason, a part of the signal at the wiring conductor layer may be transmitted to the resistor region due to the capacitance-coupling. Conversely, a part of the signal current flowing through the resistor region may leak into the wiring conductor. Signal transmissions due to the capacitance-coupling cause crosstalk, parasitic oscillation, maloperation, etc.

The capacitance-coupling can be suppressed by thickening the insulation film in the intersection area which exists between the resistor region and the wiring conductor layer. However, an increase in the thickness of the insulation film on the resistor region inevitably increases the thickness of the insulation layers on other circuit elements. As a result, the depths of the contact holes increase, and wiring conductor layers extending from the contact holes and over the insulation layer may be open-circuited at the edge of the contact holes. Furthermore, the patterning of fine wiring conductor layers becomes difficult.

SUMMARY OF THE INVENTION

An object of the present invention, therefore, is to provide an improved semiconductor device with a resistor region and a crossing conductor layer.

Another object of the present invention is to provide an integrated semiconductor circuit device with an improved intersecting structure of a resistor region and a wiring conductor layer.

Still another object of the present invention is to provide a semiconductor integrated circuit device in which a capacitance-coupling is prevented between a resistor region and a wiring conductor layer.

A semiconductor device according to the present invention comprises a resistor region and a wiring conductor crossing the resistor region. Further, an additional conductor layer, which is a.c.-grounded is provided between the resistor region and the wiring conductor layer. The additional conductor layer is isolated from both the resistor region and the wiring conductor.

The additional conductor layer cooperates with the wiring conductor layer to form a first capacitor therebetween. A second capacitor is formed between the additional conductor layer and the resistor region. Accordingly, the wiring conductor layer and the resistor region are equivalently capacitance-coupled to each other via the first and second capacitors. However, the additional conductor layer is grounded with respect to AC (alternating current). In other words, the junction point between the first and second capacitors is connected to an AC-grounded point. The term "AC-grounded" is used throughout this specification to mean "connected to the ground potential through a substantially zero AC-impedance". Therefore, the additional conductor layer may be AC-grounded by being directly connected to a ground wiring conductor layer or to a power voltage wiring conductor layer which is grounded through a substantially zero internal AC impedance of a power voltage source.

Therefore, an AC signal transmitted from the wiring conductor through the first capacitor is fed to the AC-grounded point by the additional conductor layer. An AC signal transmitted from the resistor region through the second capacitor is also fed to the AC-grounded point. This means that the resistor region and the wiring conductor layer are electrically shielded to prevent the transmission of the AC signal between them.

Thus, the present invention prevents mutual transmission of AC signals by bypassing them to ground, instead of by removing or suppressing the capacitance-coupling between the resistor region and the wiring conductor layer.

The additional conductor layer may be connected to an output end of a constant-voltage generating circuit which is constructed in an integrated semiconductor circuit device, because the constant-voltage generating circuit has a substantially zero or sufficiently low AC impedance at its output end.

BRIEF DESCRIPTION OF THE DRAWINGS

The above and other objects, advantages and features of the present invention will be more apparent from the following description taken in conjunction with the accompanying drawings, wherein.

DETAILED DESCRIPTION OF THE PREFERRED EMBODIMENTS

Figure 1A:
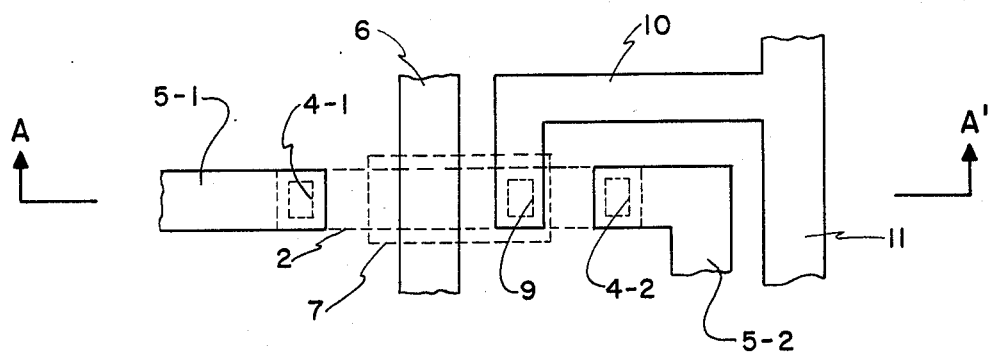
FIG. 1A is a partial plan view of an integrated semiconductor circuit device according to a preferred embodiment of the present invention.
Figure 1B:
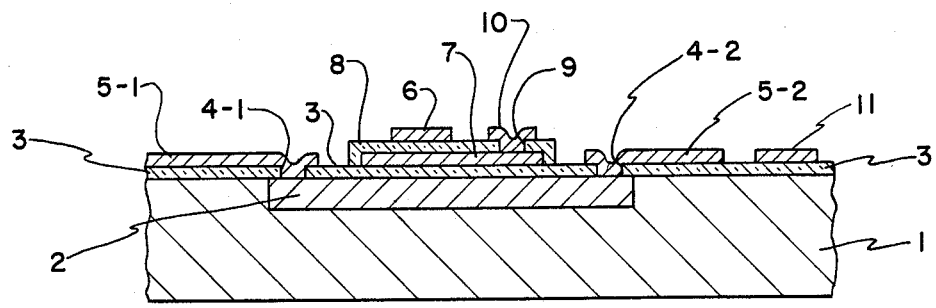
FIG. 1B is a cross sectional view along a line A—A' of FIG. 1A.

Referring now to FIGS. 1A and 1B, a preferred embodiment of the present invention will be explained. The integrated semiconductor circuit device shown in FIGS. 1A and 1B has an N-type silicon substrate 1 with an impurity concentration of $1 \times 10^{15}$ to $5 \times 10^{15}$ cm$^{-3}$. A resistor region 2 having a surface concentration of $5 \times 10^{18}$ cm$^{-3}$ and a depth of 2 μm is formed in the substrate 1 by diffusing P-type impurities, such as boron. Regions for other circuit elements, such as transistors, are formed in other portions of the substrate 1, but they are not shown in order to simplify the drawings. The transistors which are formed in the substrate 1 along with the resistor region 2 are an insulated gate and/or bipolar type. In forming bipolar transistors, an isolation region is required to isolate the repective transistors. The isolation region is formed by insulator or by a semiconductor region of the opposite conductivity type (namely, a P-type) to the substrate 1.

The resistor region 2 has a slender configuration to obtain a desired resistance value. The resistor region 2 and substrate 1 are covered with an insulation film 3 (approximately 4000 Å in thickness) made of a silicon dioxide. Other insulator material may be used as the insulation film. The insulation film 3 is provided with two contact holes 4-1 and 4-2 for making electrical connections to opposite ends of the resistor regions 2. Metal (for example, aluminum) conductor layers 5-1 and 5-2 are connected to the resistor region 2 through the contact holes 4-1 and 4-2 respectively. The conductor layers 5-1 and 5-2 extend over the insulation layer 3 either to supply an electrical potential or a signal to the region 2 or to connect it to other circuit elements. Therefore, the conductor layers 5-1 and 5-2 serve as electrodes for the resistor region 2 and further as wiring conductor layers, respectively.

Since the resistor region 2 is narrow or slender, another metal (aluminum) wiring layer 6 crosses the resistor region 2, as shown in FIG. 1A. For this reason, the resistor region 2 and the wiring layer 6 are capacitance-coupled to each other. A part of the signal passing through the wiring layer 6 may be fed to the resistor region 2, as described hereinbefore.

In order to prevent the signal transmission by this capacitance-coupling, an additional conductor layer 7 is formed on the insulation film 3 covering the resistor region 2. This conductor layer 7 is made of poly-crystalline silicon. The layer 7 has a thickness of 0.2 to 0.5 μm, and is doped with P-type impurities, such as boron, with the impurity concentration of about $1 \times 10^{18}$ cm$^{-3}$. The polycrystalline silicon layer 7 is covered with an insulation film 8 made of silicon dioxide. The film 8 has thickness of approximately 0.5 μm. The wiring layer 6 is formed to cross the resistance layer 2 on the insulation film 8. The insulation film 8 has a contact hole 9 for the polycrystalline silicon layer 7. A metal (aluminum) conductor layer 10 is connected through the contact hole 9 to the layer 7. The conductor layer 10 is connected to a metal (aluminum) wiring conductor layer 11 which provides a ground potential to the integrated semiconductor circuit device in which the resistor region 2 is formed. The metal conductor layers 5-1, 5-2, 6, 10, and 11 can be formed at the same time.

The wiring conductor layer 11 which is supplied with the ground potential is AC-grounded. Therefore, the poly-crystalline silicon layer 7 is both AC- and DC-grounded. The layer 7 is wider than the resistor region 2 and has a length which is greater than the width of the wiring conductor 6. The resistor is long enough to form the contact hole 9 in the film 8 covering the layer 7, as apparent from FIG. 1A. That is, the layer 7 contains the opposing portion of the resistor region 2 to the wiring layer 6.

A first capacitor using the insulation film 8 as a dielectric film is formed between the wiring layer 6 and the poly-crystalline silicon layer 7. Between the resistor region 2 and the layer 7, a second capacitor is formed by using the insulation film 3 as a dielectric film. In other words, the resistor region 2 and the wiring layer 6 are coupled to each other through the first and second capacitors. However, the poly-crystalline silicon layer 7 is AC-grounded by the conductor layers 10 and 11. This means that the junction point between the first and second capacitors is AC-grounded. Therefore, an AC signal component from the wiring layer 6 may pass through the first capacitor and a component from the resistor region 2 may pass through the second capacitor, but these signals are bypassed to the ground through the poly-crystalline silicon layer 7 and the conductor layers 10 and 11. As a result, the signal of the wiring layer 6 are prevented from being transmitted to the resistor region 2, and vice versa.

The poly-crystalline silicon layer 7 may be made slightly more narrow than the resistor region 2. The length of layer 7 may be shortened so that one of its end portions is slightly covered by the wiring layer 6. Also in this case, the above-mentioned effect is sufficiently achieved, since the poly-crystalline silicon layer 7 is interposed between the resistor region 2 and the wiring layer 6 at a majority of their crossing portion.

The resistor region 2 is formed by diffusing P-type impurities into the substrate 1. The impurities diffuse in the depth direction of the substrate 1, and also diffuse along the surface of the substrate 1. Consequently, both the width and length of the resistor region 2 become greater than design values. The poly-crystalline silicon layer 7 and the wiring conductor layer 6 are respectively formed during different steps. For this reason, deviations occur in the alignment relationships between the resistor region 2 and the layer 7, and between the layer 7 and the wiring layer 6. Accordingly, the width of the poly-crystalline silicon layer 7 is preferably more than 5 μm greater than the width of the resistor region 2. The layer 7 is designed to project from the side end of the wiring layer 6 by more than 5 μm.

The layer 7 may be AC-grounded by connecting the conductor 10 to a power voltage wiring conductor, to an output end of a bias voltage generating circuit, or to a semiconductor region to which the power voltage or ground potential is supplied. The poly-crystalline silicon layer 7 may be extended to connect it to the ground wiring layer 11. In this instance, the contact hole 9 and the conductor layer 10 are no longer needed; therefore, the wiring density can be increased.

Figure 2:
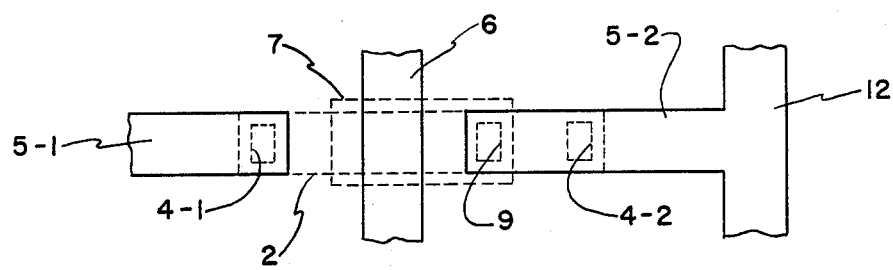
FIG. 2 is a plan view showing a modified version of the semiconductor device shown in FIG. 1.

There are some resistor regions wherein each region has one end connected to the power or ground wiring conductor. That is, as shown in FIG. 2, the electrode 5-2 is connected through the contact hole 4-2 to one end portion of the resistor region 2. electrode 5-2 is also connected to a power wiring conductor layer 12. A DC potential is applied to the power wiring layer 12 so that it is substantially grounded with respect to AC. Therefore, the poly-crystalline silicon layer 7 has an AC-grounded state when it is connected from the electrode 5-2 through the contact hole 9 to the layer 7, as shown in FIG. 2.

In this preferred embodiment, the conductor layer 10 shown in FIG. 1 is no longer necessary, and hence the device construction is simplified. The other constituents of this device are the same as those shown in FIG. 1. Therefore, they have the same reference numerals and their further description will not be repeated here.

In the integrated semiconductor devices, a multilayer wiring construction is utilized in order to increase the wiring density. Utilizing this construction, an additional conductor layer can be formed between the resistor region and the wiring conductor crossing the region with an isolation at the resulting intersections, without adding any fabrication processes. One example of this is shown in FIG. 3.

Figure 3:
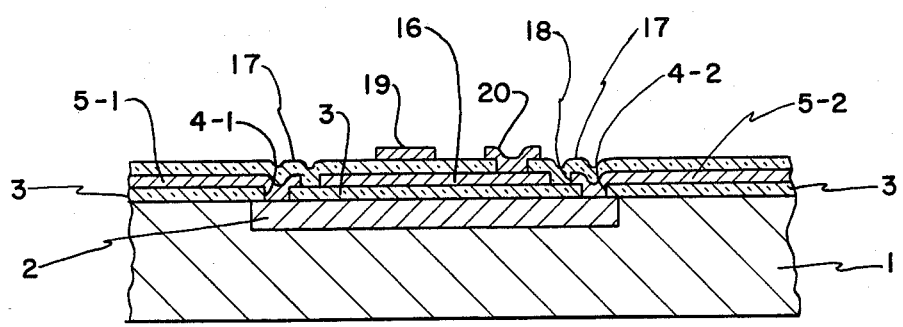
FIG. 3 is a partial cross sectional view showing an integrated semiconductor circuit device according to another preferred embodiment of the present invention.

In FIG. 3, the insulation film 3 is formed on the substrate 1 in which the resistor region 2 and another region for circuit elements (not shown in the drawing) are formed. Desired contact holes, including the contact holes 4-1 and 4-2 for the resistor region 2, are formed in the insulation film 3. A metal (aluminum) layer having a thickness of 1.3 μm is formed over all the surface. By patterning this metal layer, first wiring conductor layers are formed. The first wiring conductors include the wiring conductors 5-1 and 5-2 are connected through the contact holes 4-1 and 4-2 to the resistor region 2. At the same time, a metal conductor layer 16 having the same functions as the polycrystalline silicon layer 7 shown in FIG. 1 is formed.

The first wiring conductor layers, containing the conductor layers 5-1 and 5-2 and the conductor layer 16 are covered with an insulation film 17 made of, for example, silicon dioxide with a 5000 Å thickness. The film 17 is formed to isolate the first wiring conductors from the second wiring conductors formed thereon. Desired contact holes, including the contact hole 18 for the conductor layer 16, are formed in the layer insulation film 17, and a metal (aluminum) layer having a thickness of 2 μm is formed thereover. By patterning this aluminum layer, the second wiring conductors containing a wiring conductor 19 which crosses the resistor region 2 are formed. At the same time, a conductor 20 is formed to connect the conductor layer 16 to the power or ground wiring conductor layer.

Since the conductor layer 16 is substantially AC-grounded, the signal transmission is prevented from the wiring conductor 19 to the resistor region 2. Furthermore, the conductor layers 16 and 18 are formed simultaneously during the formation steps of the first and second wiring layers, respectively. Accordingly, no additional fabrication process is required.

The conductor layer 16 may be connected directly through a contact hole made in the insulation film 17 to the power or ground wiring conductor layer by elongating the conductor layer 16 under the power or grounding wiring conductor. In this case, the layer 18 is omitted. If the conductor 5-1 or 5-2 is connected to an AC-grounded wiring conductor layer such as the power or ground wiring layer, the conductor 5-1 or 5-2 and the conductor layer 16 can be formed continuously in accordance with FIG. 2.

In FIGS. 1, 2 and 3, more than two wiring conductors sometimes cross the resistor region 2. Also in this case, the signal transmission from the respective wiring conductors to the resistor region 2 can be prevented by forming the conductor layers 7 and 16 in an elongated shape.

Referring to FIGS. 4 to 10, still another preferred embodiment of the present invention will be described along with its fabrication process.

Figure 4:
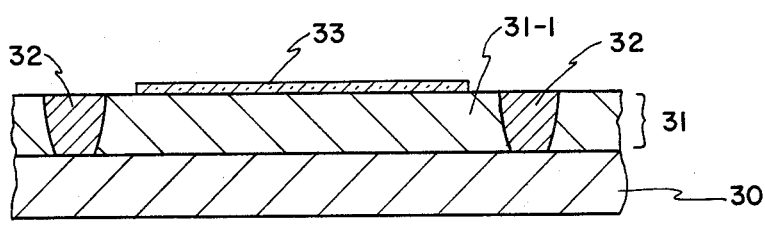
FIGS. 4 to 9 are partial cross sectional views showing a manufacturing process of a semiconductor integrated circuit device according to still another preferred embodiment of the present invention, respectively.

As shown in FIG. 4, a P-type silicon substrate 30 having a resistivity of 1 to 3 Ω-cm is provided. An N-type silicon epitaxial layer 31 having a resistivity of 1 Ω-cm and a thickness 5 μm is grown on the substrate 30. By diffusing P-type impurities (for example, boron) into the epitaxial layer 31, an isolation region 32 having a surface impurity concentration of $1 \times 10^{19}$ cm$-3$ is formed. The isolation region 32 reaches the substrate 30 to separate the epitaxial layer 31 into a number of island regions. FIG. 4 shows one island region 31-1. A silicon oxide film having a thickness of approximately 500 Å is formed on the epitaxial layer 31 by thermal oxidation. Further, a silicon nitride film 33 having a thickness of approximately 1000 Å and serving as an oxidation-resist film is formed by a low pressure chemical vapor deposition (LPCVD). The silicon nitride film is then removed, without leaving parts covering portions of the epitaxial layer 31 in which transistors, resistors, etc. are formed. As a result, a silicon nitride film 33 is formed to selectively cover the island region 31-1 in which a resistor region is formed. It is noted that other nitride films and the silicon oxide film formed between the nitride film and the epitaxial layer 31 are not shown.

Figure 5:
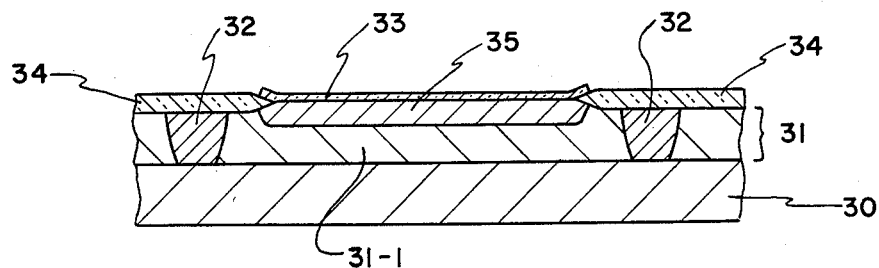

Thereafter, a field silicon oxide film 34 having a thickness of 0.5 to 1 μm is formed by the local oxidation technique using the nitride film 33 as a mask, as shown in FIG. 5. N-type impurities are introduced into the portions, such as collector contact regions and the like, and are additionally covered with, for example, a photoresist film. P-type impurity ions, such as boron, are then implanted with a dose amount of $1 \times 10^{14}$ cm$^{-2}$ and an energy of 80 keV. The P-type impurity ions are not introduced into the epitaxial layer 31 due to the existence of the field oxidation film 34 and the photoresist, but the ions are actually introduced through the nitride film 33 and into the island region 31-1. This is because the nitride film 33 is not covered with the photoresist film. By this step, a resistor region 35 with a surface impurity concentration of $1 \times 10^{17}$ cm$^{-1}$ and a depth of 0.6 μm is formed in the island region 31-1. Other P-type regions, such as base regions of transistors, are formed simultaneously.

Figure 6:
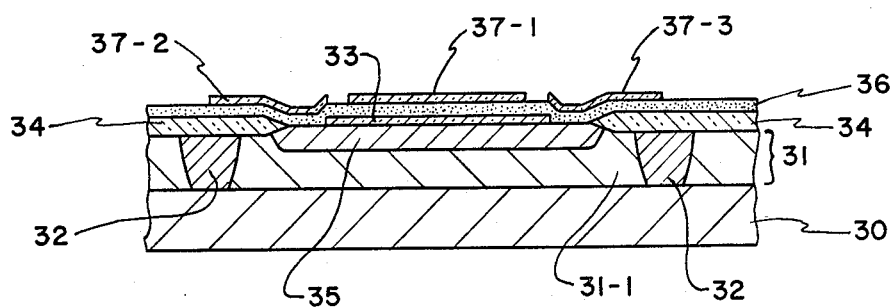

As shown in FIG. 6, the nitride film 33 and the oxide film under it (but not shown in the drawing) are selectively removed to form contact holes for the resistor region 35. Simultaneously with this step, the nitride films and oxidation films are also removed on portions in which the base regions and collector contact regions of transistors are to be formed. Thereafter, a poly-crystalline silicon layer 36 having a thickness of approximately 5800 Å is formed over the entire surface. An oxidation-resist film (silicon nitride film) is formed to a thickness of 1000 Å for the selective oxidation of the poly-crystalline silicon layer 36. Although not shown in the drawing, a silicon oxide film having a thickness of 500 Å exists between this nitride film and the poly-crystalline silicon layer 36. The silicon nitride film is patterned to form electrodes for the respective regions of transistors, resistors and other circuit elements, poly-crystalline silicon resistors, and poly-crystalline silicon wiring layers. FIG. 6 shows nitride film 37-2 and 37-3 for forming electrodes for the resistor region 35. Further, a nitride film 37-1 for forming a conductor layer according to the present invention is formed by this patterning process.

Figure 7:
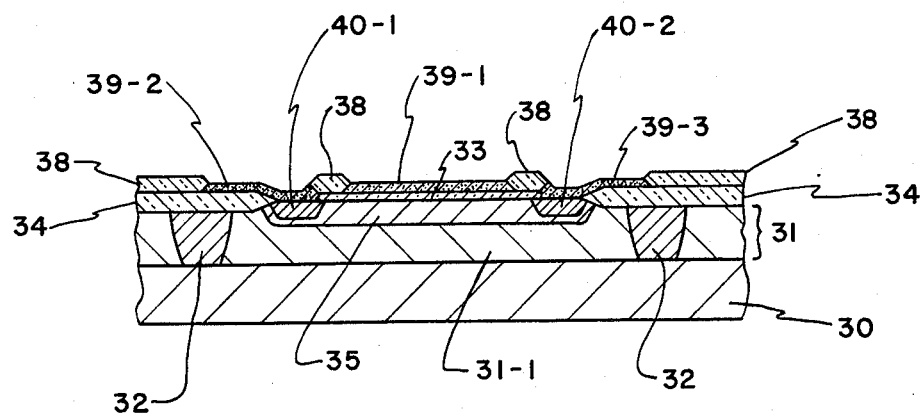

The portions of the poly-crystalline silicon layer 36 which are not covered with the silicon nitride films 37-1 to 37-3 are changed into silicon oxide films 38, as shown in FIG. 7, by thermal oxidation, for several hours, at about 1,000° C. As a result, electrode patterns 39-2 and 39-3 for the resistor region 35 and a conductive layer pattern 39-1 are formed according to the present invention. The other electrode patterns for other circuit elements, the poly-crystalline silicon resistor patterns, and the poly-crystalline silicon wiring patterns are also formed.

The nitride films such as the nitride films 37-1 to 37-3 are removed for the selective oxidation of the poly-crystalline silicon layer 36. Thereafter the portions into which N-type impurities should be introduced to form, for example, emitter and collector contact regions of transistors are covered with a mask (such as a photoresist film) in order to diffuse P-type impurities. By thermal diffusion, P-type impurities such as boron are doped in the resistor electrode patterns 39-2 and 39-3 as well as the conductor pattern 39-1 with an impurity concentration of $1 \times 10^{19}$ cm$^{-3}$. The P-type impurities diffused into the resistor electrode patterns 39-2 and 39-3 reach the resistor region 35 to form resistor contact regions 40-1 and 40-2 having a surface impurity concentration of $5 \times 10^{18}$ cm$^{-3}$.

The poly-crystalline silicon layers such as the electrode patterns 39-2 and 39-3 and the conductor pattern 39-1 doped with the P-type impurities are covered with mask layers, respectively. After removing the masks from the portions into which N-type impurities are to be introduced, phosphorus or arsenic (N-type) impurities are diffused into those portions which to form emitter and collector contact regions of transistors (not shown).

Figure 8:
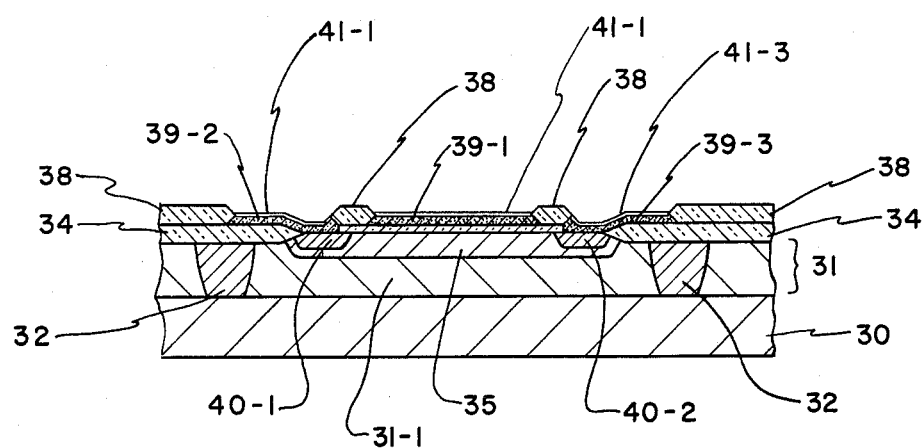

Thereafter, platinum is deposited with a thickness of approximately 900 Å on the poly-crystalline layers such as the resistor electrode patterns 39-2 and 39-3, the conductor layer 39-1, etc. By a heat treatment, platinum silicide layers 41-1 to 41-3 each having a thickness of approximately 2000 Å are formed, as shown in FIG. 8. The platinum silicide layers 41-1 to 41-3 are formed for the purpose of reducing the resistance values of the poly-crystalline layers 39-1 to 39-3. Therefore, the step for forming the platinum silicide layers may be omitted.

Figure 9:
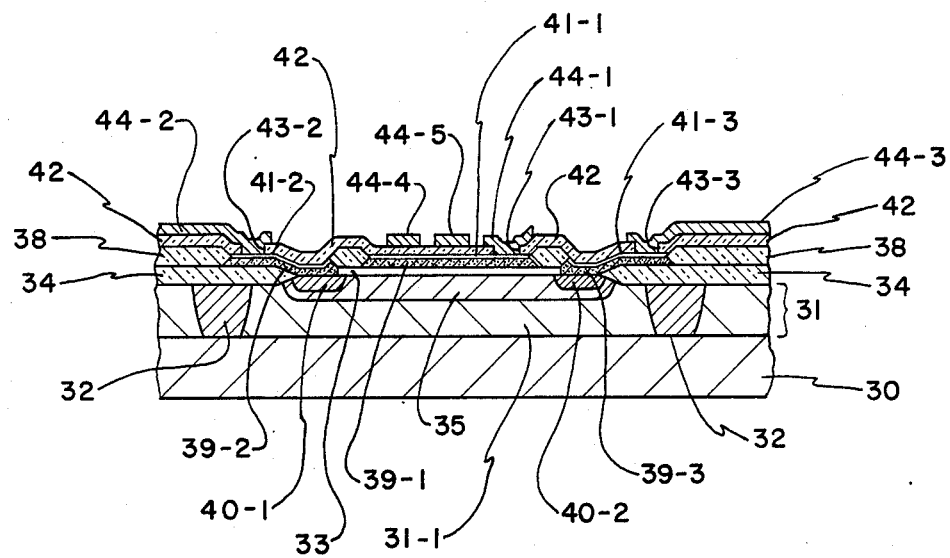
Figure 10:
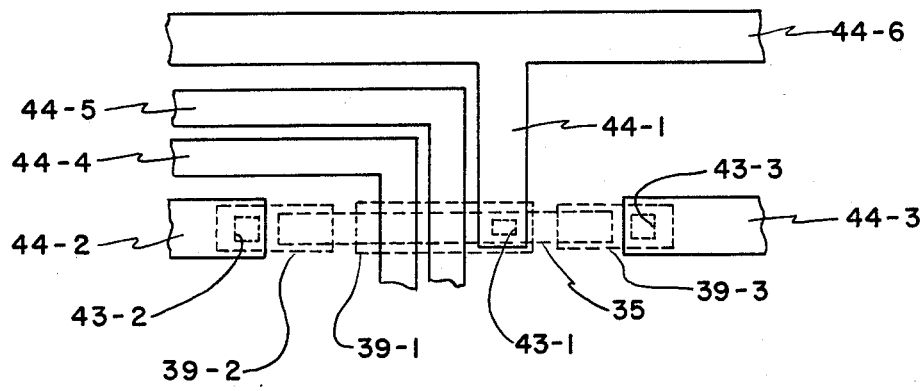
FIG. 10 is a plan view of FIG. 9.

Next, as shown in FIG. 9, the entire surface is covered by a chemical vapor deposition to form a silicon oxide film 42 having a thickness of approximately 5000 Å. The silicon oxide film 42 is selectively removed to form desired contact holes. FIG. 9 shows a contact hole 43-1 for the conductor layer 39-1 and contact holes 43-2 and 43-3 for the resistor electrodes 39-2 and 39-3. Thereafter, aluminum is deposited with a thickness of 1.3 μm over the entire surface, and it is then patterned to form wiring conductors. As a result, wiring layers 44-2 and 44-3 are formed for connecting the resistor electrodes 39-2 and 39-3 to other circuit elements. Further, two wiring conductor layers 44-4 and 44-5 crossing the resistor region 35 are also formed. Furthermore, a wiring conductor 44-1 having one end portion connected to the conductor layer 39-1 through the contact hole 43-1 are also formed. As is apparent from FIG. 10, the other end portion of the wiring conductor 44-1 is connected to a ground wiring conductor layer 44-6. The ground wiring conductor 44-6 is formed simultaneously with the conductors 44-1 to 44-5.

The intersecting portion of the wiring conductors 44-4 and 44-5 and the resistor region 35 has therein the conductor layer 39-1 which is AC- and DC-grounded. Therefore, the signal transmission is prevented from the wiring conductors 44-4 and 44-5 through the capacitance-coupling to the resistor region 35.

The isolation between the conductor layer 39-1 and the resistor region 35 is performed by the nitride film 33 used for the selective oxidation of the poly-crystalline silicon layer 36. Therefore, an additional insulation film is not needed. In this preferred embodiment, the plane configuration of the resistor region 35 and the plane patterns of the resistor electrodes 39-2 and 39-3 and the conductor layer 39-1 are determined by the selective (local) oxidation technology. Therefore, the area occupied by the resistor region 35 is reduced and the misalignment between the region 35 and the respective layers 39-1 to 39-3 is suppressed.

The wiring conductor 44-1 can be connected to another wiring conductor such as a power wiring conductor layer which is in a substantially AC-grounded state. The poly-crystalline silicon conductor 39-1 may be formed so that its one portion exists under the grounding wiring conductor 44-6 to directly connect the conductor 44-6 to the conductor 39-1 through the contact hole 43-1.

As described in detail in the above, the present invention provides integrated semiconductor circuit devices having an improved crossing structure at the intersection between a resistor region and a wiring conductor layer for preventing the signal leakage due to the capacitance-coupling.

The materials, impurity concentrations, dimensions, etc. of the respective constituents shown in the above preferred embodiments of the present invention are not critical, but can be modified without departing from the scope and spirit of the present invention. In addition, the present invention is applicable to another intersecting structure of, for example, a poly-crystalline semiconductor resistor and a wiring conductor. The poly-crystalline semiconductor resistor is constituted by a poly-crystalline semiconductor layer formed through an insulation film on a semiconductor substrate in which a number of circuit elements are formed.

What is claimed is:

1. A semiconductor device comprising a semiconductor layer of one conductivity type; a resistor region of an opposite conductivity type formed in said semiconductor layer; a first silicon-oxide film having a portion buried in said semiconductor layer and surrounding said resistor region; a silicon film selectively covering a central portion of said resistor region and exposing opposing end portions of said resistor regions; first and second polycrystalline semiconductor electrode layers connected respectively to said end portions of said resistor region and extending over said first silicon oxide film; a polycrystalline semiconductor shield layer formed on said silicon nitride film; a second silicon oxide film separating said first and second polycrystalline semiconductor electrode layers and said polycrystalline semiconductor shield layer from one another; a third silicon oxide film covering said first and second polycrystalline semiconductor electrode layers, said polycrystalline semiconductor shield layer, and said second silicon oxide film; a first contact hole formed in said third silicon oxide film to expose a part of said polycrystalline semiconductor shield layer; second and third contact holes formed in said third silicon oxide film to expose parts of said first and second polycrystalline semiconductor electrode layers, respectively; a first wiring layer extending over said third silicon oxide film to cross said polycrystalline semiconductor shield layer over said resistor region; a second wiring layer provided separately from said first wiring layer and supplied with a reference potential; a third wiring layer connected to said part of said first polycrystalline semiconductor electrode layer through said second contact hole; a fourth wiring layer connected to said part of said second polycrystalline semiconductor electrode layer through said third contact hole; and a conductive layer connected through said first contact hole to said part of said polycrystalline semiconductor shield layer and extending to said second wiring layer to supply said reference potential to said polycrystalline semiconductor shield layer.

2. The semiconductor device as claimed in claim 1, wherein said semiconductor layer is an N-type material, said resistor region being a P-type material, and said reference potential being a ground potential.

3. The semiconductor device as claimed in claim 1, wherein said surface portion of each of said first and second polycrystalline semiconductor electrode layers and said polycrystalline semiconductor shield layer is converted into an alloy layer which is made of a metal and a semiconductor.

* * * * *